United States Patent
Gower et al.

[19]

[11] Patent Number: 5,966,940
[45] Date of Patent: Oct. 19, 1999

[54] SEMICONDUCTOR THERMAL CONDITIONING APPARATUS AND METHOD

[75] Inventors: Roger Gower, Nashua, N.H.; John Kingery, Eden Prairie, Minn.; J. Cameron Guthrie, Plymouth, Minn.; Kevin Frost, St. Louis Park, Minn.; Steve Miller, Minneapolis, Minn.; Ken Uekert, Moundsview, Minn.

[73] Assignee: Micro Component Technology, Inc., St. Paul, Minn.

[21] Appl. No.: 08/972,312

[22] Filed: Nov. 18, 1997

[51] Int. Cl.$^6$ .............................. F25B 21/02; F25B 29/00
[52] U.S. Cl. .................................. 62/3.3; 62/3.7; 165/61
[58] Field of Search .................................. 62/3.3, 3.7, 62

[56] References Cited

U.S. PATENT DOCUMENTS

| | | | |
|---|---|---|---|
| 4,037,270 | 7/1977 | Ahmann et al. | 361/385 |
| 4,253,515 | 3/1981 | Swiatosz | 165/61 |
| 4,462,796 | 7/1984 | Amundson et al. | |
| 4,478,352 | 10/1984 | Amundson et al. | |
| 4,579,527 | 4/1986 | Wedel et al. | |
| 4,848,090 | 7/1989 | Peters | 62/3.3 |
| 4,866,824 | 9/1989 | Falk et al. | |
| 5,126,656 | 6/1992 | Jones. | |
| 5,164,661 | 11/1992 | Jones. | |
| 5,269,146 | 12/1993 | Kerner. | |
| 5,287,294 | 2/1994 | Baert et al. | |
| 5,315,240 | 5/1994 | Jones. | |
| 5,316,078 | 5/1994 | Cesaroni. | |
| 5,420,521 | 5/1995 | Jones. | |
| 5,613,364 | 3/1997 | Higgins. | |
| 5,809,785 | 9/1998 | Polkinghorne | 62/3.7 |
| 5,847,293 | 12/1998 | Jones. | |

FOREIGN PATENT DOCUMENTS

WO 97/15837  5/1997  WIPO.

*Primary Examiner*—Henry Bennett
*Assistant Examiner*—Melvin Jones
*Attorney, Agent, or Firm*—Merchant & Gould P.C.

[57] ABSTRACT

An apparatus for thermally conditioning a semiconductor unit is provided which includes a surface plate for receiving the semiconductor unit thereon which is connected to a thermoelectric device and a closed loop heat exchanger. At least one temperature sensor is disposed adjacent the surface plate for sensing the temperature of the surface plate. The thermoelectric device has first and second sides with the first side disposed against the surface plate. The closed loop heat exchanger is coupled to the second side of the thermoelectric device. The closed loop heat exchanger includes a chamber or cavity having an inlet and an outlet with the chamber disposed adjacent the second side of the thermoelectric device. The closed loop heat exchanger further includes conduit connected to the inlet and outlet of the chamber and a heat transfer unit connected to the conduit opposite the chamber. Heat transfer fluid is contained within the closed loop heat exchanger and a pump is provided for pumping the heat transfer fluid through the closed loop heat exchanger wherein the heat transfer unit transfers heat to or from the heat transfer fluid to control the temperature of the heat transfer fluid. The thermoelectric device transfers heat to or from the surface plate to thermally condition the semiconductor unit disposed on the surface plate while the closed loop heat exchanger transfers heat to or from the second side of the thermoelectric device which increases the range of temperature under which the semiconductor unit may be thermally conditioned.

13 Claims, 9 Drawing Sheets

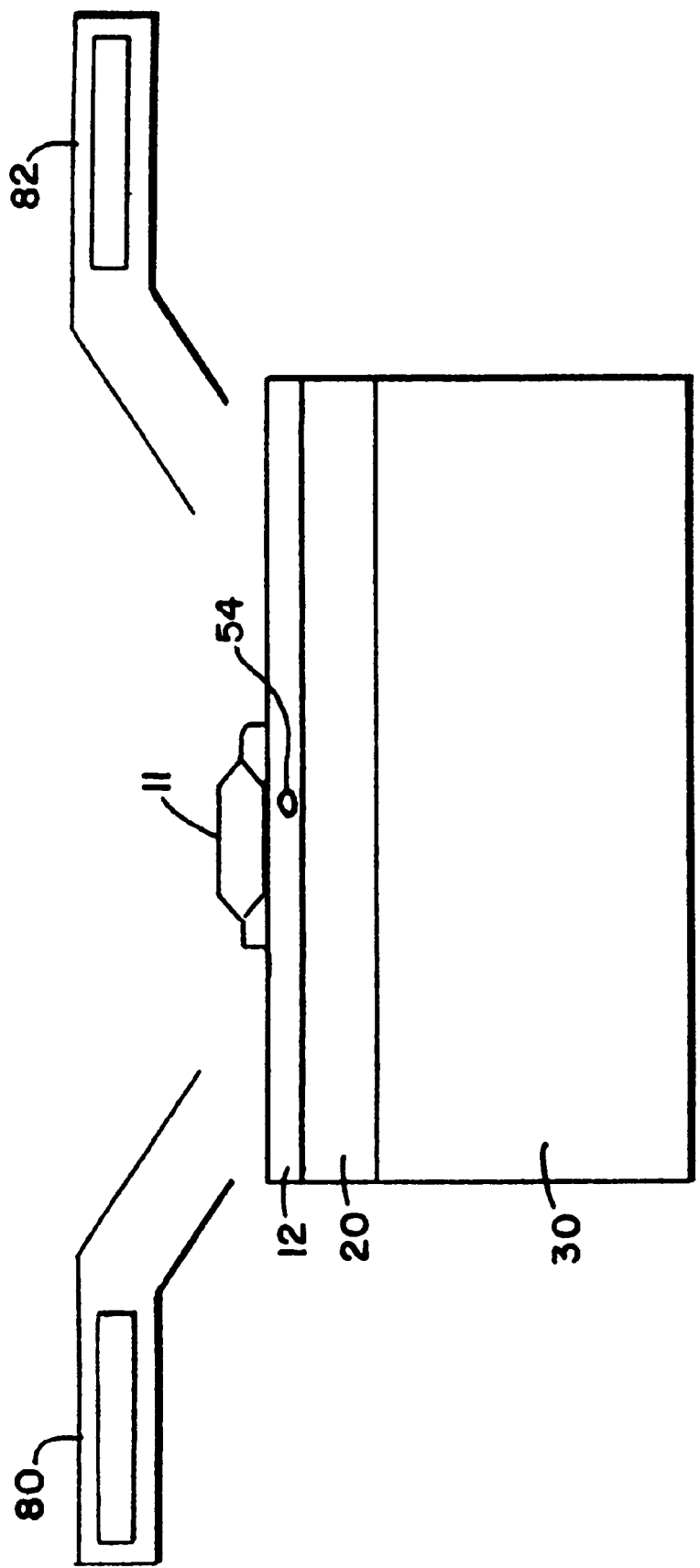

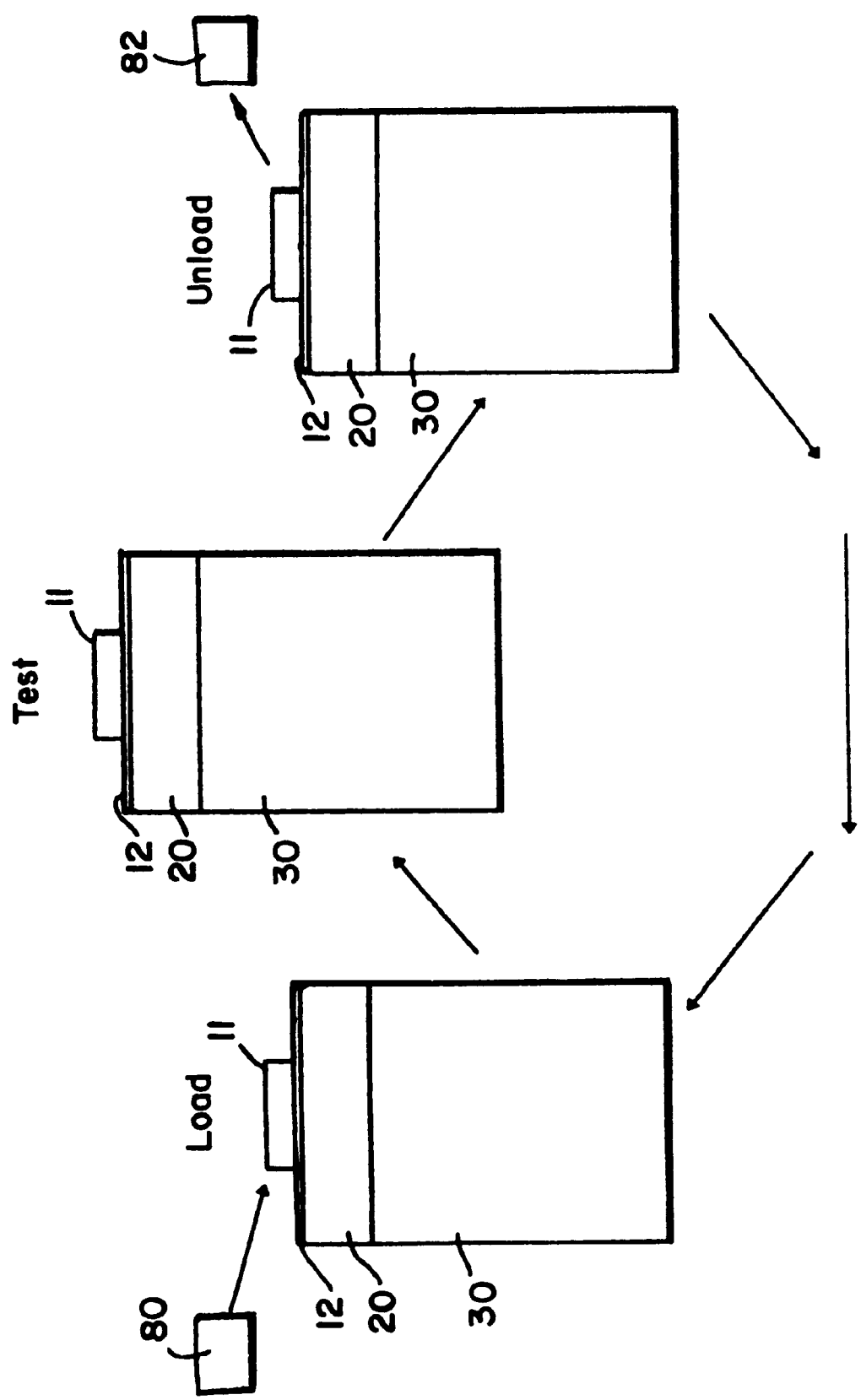

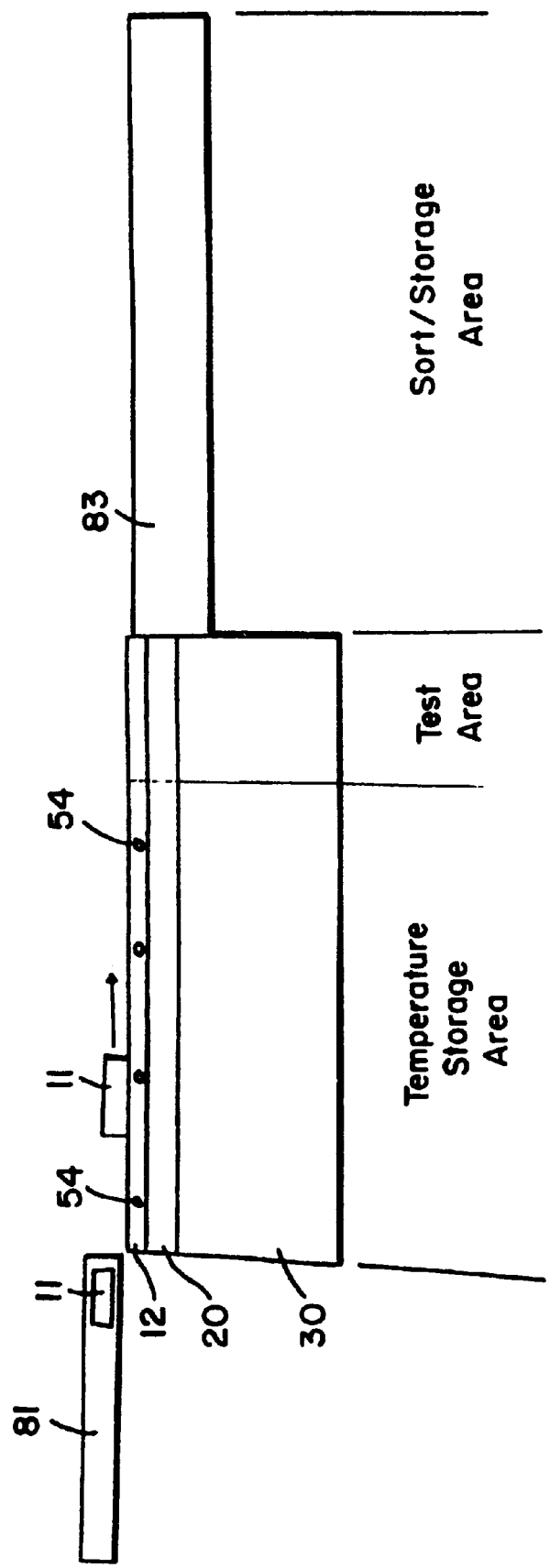

ic device and a closed loop heat exchanger. At least one temperature sensor is disposed adjacent the surface plate for sensing the temperature of the surface plate. The thermoelectric device has first and second sides with the first side disposed against the surface plate. The closed loop heat exchanger is coupled to the second side of the thermoelectric device. The closed loop heat exchanger includes a chamber or cavity having an inlet and an outlet with the chamber

SEMICONDUCTOR THERMAL CONDITIONING APPARATUS AND METHOD

BACKGROUND OF THE INVENTION

1. Field of the Invention

This invention relates generally to the field of handlers for feeding integrated circuit or semiconductor devices to a tester for testing and evaluating the integrated circuit devices. More particularly, the invention relates to a handler apparatus for heating or cooling the integrated circuit or semiconductor devices to temperature conditions under which the devices will operate for testing.

2. Description of the Art

Various types of integrated circuit devices having evolved since the development of the semiconductor. Such devices have innumerable applications in industry and commerce. In many of these applications, it is essential that these devices be accurate to a defined minimum percentage of accuracy. Thus, it is necessary to test the integrated circuit devices to determine whether or not they are operable and to what degree. Various high speed testing devices have been developed to measure to the quality of such integrated circuit devices. Typically, such testers can perform testing upon units at very high rates of speed. Accordingly, it has been necessary to provide handling equipment capable of rapidly feeding integrated circuit devices to a test site.

Depending on the type of the device and the application to which it is to be put, the device will be subjected to different environmental operating temperatures. For example, in one application, the semiconductor device which is being tested will ultimately function in an environment with a temperature significantly higher than ambient room temperature. Alternatively, a semiconductor device may be required to operate throughout a wide range of temperature and may require testing at different temperature extremes.

It is follows that a particularly important feature of any integrated circuit handler is that it brings the integrated circuit or semiconductor devices being handled to the temperatures at which they will ultimately operate and maintains tight control of the temperature. A variety of methods are known in the prior art for thermally conditioning semiconductor devices prior to being tested. For example, it is known to provide a soak chamber adjacent the tester so that as the semiconductor devices are transported through the soak chamber to the tester, the soak chamber brings the temperature of the semiconductor devices to the specified temperature for testing. In heating the semiconductor devices in the soak chamber, typically heaters are utilized to heat the air within the soak chamber. The heating elements may be located at the intake of a blower so that the heated air is then circulated within the soak chamber to heat the semiconductor devices. For example, U.S. Pat. No. 4,462,796 to Amundson et al. discloses an air heating system for use in heating integrated circuit chip carriers prior to the chips being tested by an electronic tester. If it is desired to cool the semiconductor devices to be tested, a typical soak chamber may include a separate cooling system such as introducing a gas of the desired temperature into the chamber to surround the semiconductor devices as they pass through the chamber. For example, a liquid nitrogen tank may be connected to a solenoid valve for introducing nitrogen gas into the soak chamber to cool the devices.

One problem with such methods of heating or cooling the semiconductor devices is the time required for changing the temperature of the soak chamber when the devices are to be tested at different temperatures. For example, to change a typical handler apparatus from testing semiconductor devices at a higher temperature such as +125 degrees Celsius to test devices at a lower temperature such as –25 degrees Celsius, it may take 30 minutes or more for the soak chamber to cool down to the desired temperature to thermally condition the semiconductor devices. Another problem is that the soak chamber constitutes an enclosed area and the system provides for the heating or cooling of the entire soak chamber including the air and the walls and base of the soak chamber as well as the semiconductor devices to be thermally conditioned. This results in wasted energy in heating or cooling of the semiconductor devices. Another problem with such soak chambers is that it is difficult to maintain the temperature of the semiconductor devices at a specific temperature. For example, there may be variations within the soak chamber so that some of the semiconductor devices differ in temperature from other devices within the chamber so that all the semiconductor devices are not tested at precisely the same temperature. Also, the enclosed nature of the soak chamber limits access to the semiconductor devices as they are transported to the tester.

Another example of a method for thermally conditioning semiconductor devices includes heating a rail on which the semiconductor devices are placed. For example, U.S. Pat. No. 4,579,527 to Wedel discloses an apparatus in which integrated circuits are transported down a track and rail in which the track and rail are heated in order to impart thermal energy to the integrated circuit devices passing down the tracks. A significant problem with such an apparatus is that it is only able to heat the integrated circuit devices and does not provide thermal conditioning for integrated circuits at lower temperatures.

What is needed is an apparatus for thermally conditioning semiconductor devices in which the semiconductor devices are quickly brought to a specified temperature and maintained at that temperature with minimum temperature fluctuation. What is further needed is an apparatus which is able to thermally condition semiconductor devices over a large range of temperatures and is able to change temperatures within a short time frame.

SUMMARY OF THE INVENTION

The present invention provides an apparatus for thermally conditioning semiconductor units which is able to bring the semiconductor unit to a specified temperature in a short time period and is able to maintain the temperature of the semiconductor units at that temperature with minimum temperature fluctuation. The present invention further provides an apparatus which is able to operate over a wide range of temperatures for thermally conditioning semiconductor units and is able to change temperatures at which the semiconductor units are to be thermally conditioned in a relatively short time frame.

According to one aspect of the present invention, there is provided an apparatus for thermally conditioning a semiconductor unit which includes a surface plate for receiving the semiconductor unit thereon which is connected to a thermoelectric device and a closed loop heat exchanger. At least one temperature sensor is disposed adjacent the surface plate for sensing the temperature of the surface plate. The thermoelectric device has first and second sides with the first side disposed against the surface plate. The closed loop heat exchanger is coupled to the second side of the thermoelectric device. The closed loop heat exchanger includes a chamber or cavity having an inlet and an outlet with the chamber disposed adjacent to the second side of the thermoelectric device. The closed loop heat exchanger further includes a conduit connected to the inlet and outlet of the chamber and a heat transfer unit connected to the conduit opposite the chamber. Heat transfer fluid is contained within the closed loop heat exchanger and a pump is provided for pumping the heat transfer fluid through the heat exchanger wherein the heat transfer unit transfers heat to or from the heat transfer fluid to control the temperature of the fluid.

The thermoelectric device transfers heat to or from the surface plate to thermally condition the semiconductor unit disposed on the surface plate to a specified temperature while the closed loop heat exchanger transfers heat to or from the second side of the thermoelectric device to control the temperature of the second side of the thermal electric device which increases the range of temperature under which the semiconductor unit may be thermally conditioned.

According to one embodiment of the invention, the temperature sensor is coupled to a temperature control unit. The temperature control unit is capable of bringing the surface plate to a specified temperature with the temperature control unit receiving input from the temperature sensor of the temperature of the surface plate and the temperature control unit further providing energy to the thermoelectric device to bring the temperature of the surface plate to the specified temperature.

Pursuant to another embodiment of the present invention, the heat transfer unit of the closed loop heat exchanger consists of a chiller which can control the temperature of the heat transfer fluid flowing through the closed loop heat exchanger from −40 degrees Celsius to +60 degrees Celsius. In one preferred embodiment, the thermoelectric device coupled with the closed loop heat exchanger is able to vary the temperature of the surface plate from −40 degrees Celsius to +125 degrees Celsius and maintain the surface plate at a specified temperature within that range.

In accordance with another embodiment of the present invention, the apparatus provides a thermal conditioning block having a base in which a surface plate is disposed on an upper surface of the base with at least one thermoelectric device embedded in the base of the thermal block beneath the surface plate. The base includes a cavity through which heat transfer fluid is circulated with the cavity disposed adjacent the thermoelectric device opposite the surface plate. At least one temperature sensor is embedded in the surface plate to monitor the temperature of the surface plate. The cavity in the base of the thermal conditioning block includes an inlet and outlet for circulating the heat transfer fluid through the cavity of the thermal conditioning block. Preferably, a low temperature industrial chiller is coupled to the inlet and outlet of the cavity of the thermal block to create a heat sink to remove heat from the bottom side of the thermoelectric device embedded in the thermal conditioning block to allow the surface plate and the semiconductor unit disposed thereon to be thermally conditioned within a wide temperature range.

The above-described features and advantages, along with various other advantages and features of novelty, are pointed out with particularity in the claims of the present application which form a part hereof. However, for a better understanding of the invention, its advantages and objects obtained by its use, reference should be made to the drawings which form a further part of the present application and to the accompanying descriptive manner in which there is illustrated and described preferred embodiments of the invention.

BRIEF DESCRIPTION OF THE DRAWINGS

FIG. 8 is a block diagram illustrating a general application of the present invention;

FIG. 9 is a block diagram illustrating a particular application of the present invention;

FIG. 10 is a block diagram illustrating an alternative application of the present invention.

DETAILED DESCRIPTION OF THE PREFERRED EMBODIMENT

Figure 1:
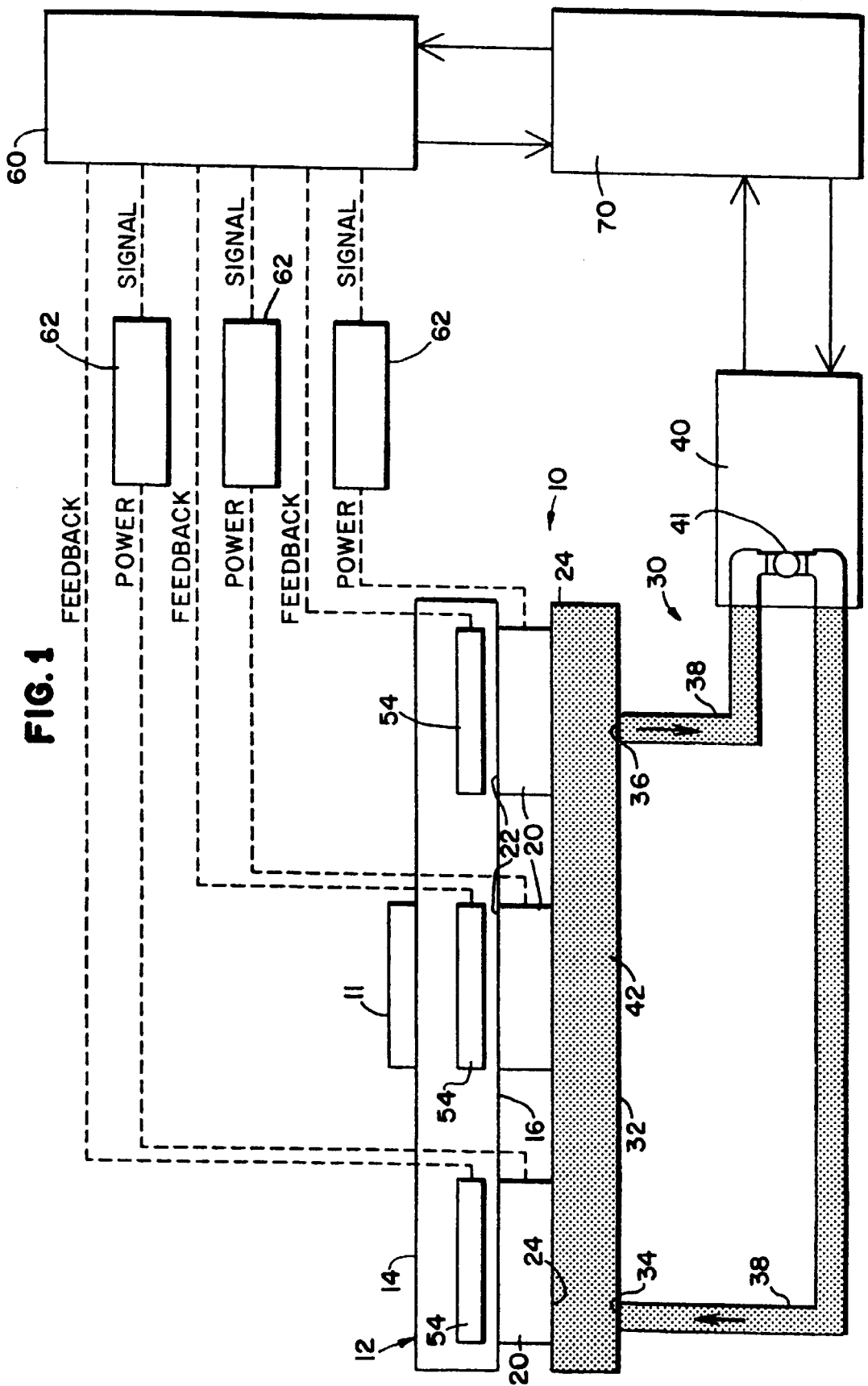
FIG. 1 is a block diagram of an apparatus for thermal conditioning of a semiconductor unit according to the principles of the present invention.
Figure 2:
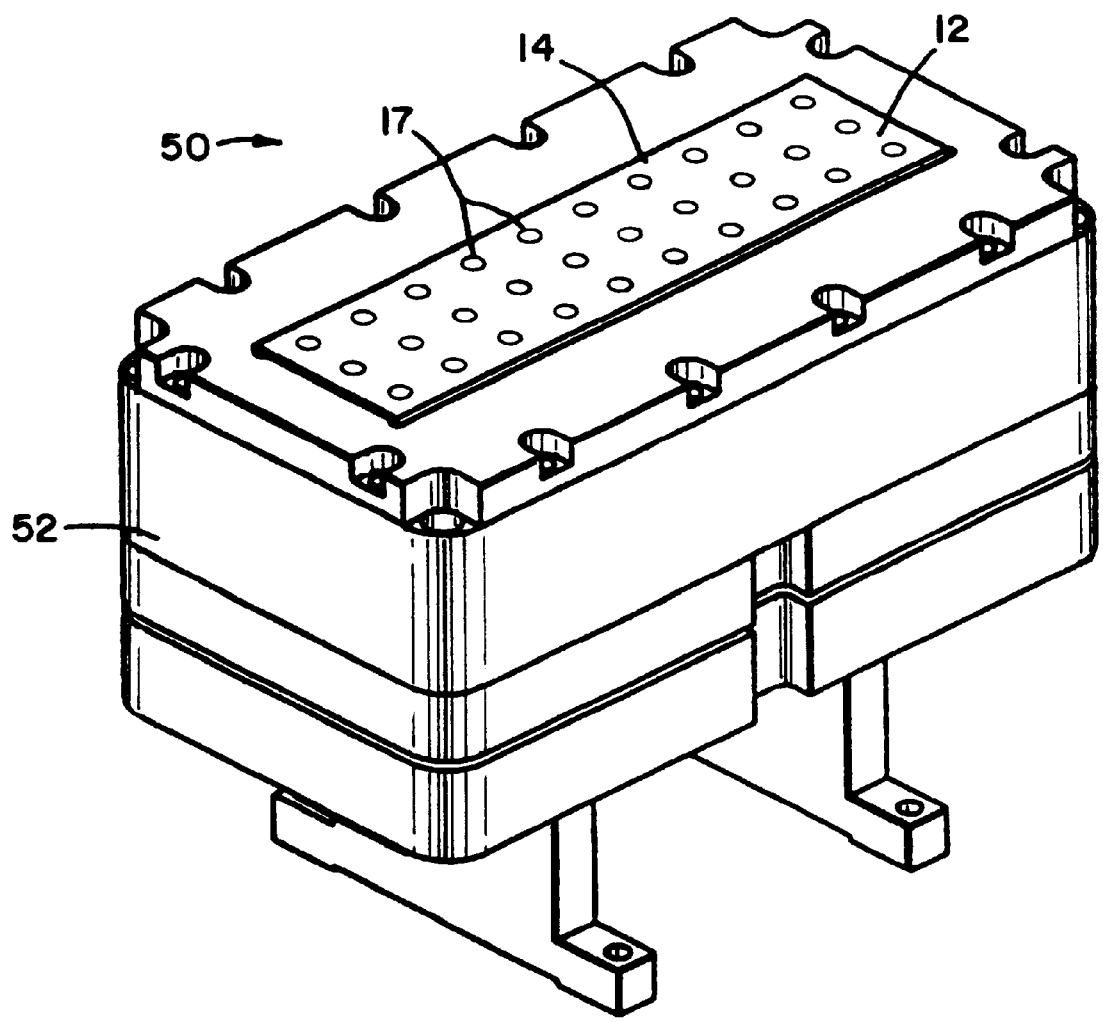
FIG. 2 is a perspective view of an embodiment of a thermal conditioning block according to the principles of the present invention.

Referring now to the drawings in which similar elements are numbered identically throughout, a description of preferred embodiments is provided. In FIG. 1, a block diagram of an apparatus for thermally conditioning a semiconductor unit according to the principles of the present invention is generally illustrated at 10. The apparatus includes a surface plate 12 disposed against a thermoelectric device 20 which is coupled to a closed loop heat exchanger 30.

The apparatus is designed for use with handler devices which feed semiconductor or integrated circuit devices into a tester for testing of the semiconductor devices. After testing, the semiconductor devices are then transported away from the tester for further processing with respect to the particular application for which the semiconductor devices are to be used. The semiconductor devices are also sorted based on the test results. Often, the semiconductor devices are required to be tested at a certain temperature which correlates to the temperature under which the semiconductor device is intended to operate in the particular application. Therefore, the handler apparatus is required to bring the semiconductor device to a specified temperature and maintain the device at that temperature while the semiconductor device is inserted into the tester for testing.

Referring to FIG. 1, the surface plate 12 of the thermal conditioning apparatus 10 includes an upper surface 14 and bottom surface 16 and is designed to receive and retain the semiconductor unit 11 on the upper surface 14 of the surface plate. The surface plate 12 is preferably composed of a metal or other similar material having high heat conductivity. The semiconductor unit is thermally conditioned to a specified temperature by conduction from the surface plate 12. As described below, the temperature of the surface plate 12 is varied and controlled across a wide temperature range so that the temperature of the semiconductor unit is correspondingly controlled.

The semiconductor unit 11 may take a variety of forms and may be at various stages in the manufacturing process. For example, the semiconductor unit 11 may be in wafer form in which a silicon disc contains numerous semiconductor devices to be tested by a prober. The semiconductor unit 11 may also be in post singulated form. Typical post singulated semiconductor devices include SOIC (Small Outline Integrated Circuit), PLCC (Plastic Leaded Chip Carrier), Bare Die, BGA (Ball Grid Array), etc. In these various forms, the semiconductor unit 11 is composed primarily of silicon. Accordingly, heat transfer from the surface plate 12 to the semiconductor unit 11 through conduction is highly efficient. Alternatively, the semiconductor unit 11 may be further processed to include a protective ceramic or plastic shell with metal contact prongs extending therefrom (see 11 in FIG. 8). In this form, the contact prongs and outer shell of the semiconductor unit 11 would rest on the surface plate 12 for heat transfer.

The bottom surface 16 of the surface plate 12 is disposed against a thermoelectric device 20, also known as a peltier device. The thermoelectric device 20 includes a first side 22 and second side 24 and creates a temperature differential across the two sides 22, 24 as electrical power is supplied to the thermoelectric device (i.e., one side of the thermoelectric device heats up while the opposite side cools down). As the first side 22 of the thermoelectric device 20 is disposed adjacent the bottom surface 16 of the surface plate 12, the thermoelectric device transfers heat to or from the surface plate 12 to bring the surface plate and the semiconductor unit disposed thereon to a specified temperature. In the embodiment shown in FIG. 1, three thermoelectric devices 20 are shown in position against the bottom surface 16 of the surface plate 12. It is appreciated that the number of thermoelectric devices utilized may be varied in accordance with the particular handler apparatus requirements to provide adequate temperature control with respect to the surface plate 12. The use of three thermoelectric devices 20 disposed against the surface plate 12 allows for more precise control of the temperature across the surface plate. In a preferred embodiment, the thermoelectric devices are Model Marlow DT12-4 thermoelectric diodes manufactured by Marlow Industries, Inc., 16451 Vista Park Road, Dallas, Tex. 75238-1645. In one preferred embodiment, the thermoelectric device 20 is able to generate a temperature differential of up to 68 degrees Celsius between the top side 22 and bottom side 24 of the thermoelectric device.

Referring to FIG. 1, the bottom side 24 of the thermoelectric device 20 is coupled to a closed loop heat exchanger 30. The closed loop heat exchanger includes a chamber or cavity 32 disposed adjacent the bottom side 24 of the thermoelectric device 20. The chamber 32 includes a fluid inlet 34 and outlet 36 so that a heat transfer fluid 42 may be circulated through the chamber 32 to transfer heat to or away from the bottom side 24 of the thermoelectric device 20. A heat transfer unit 40 is connected to the chamber 32 through conduit 38. The heat transfer unit 40 transfers heat to or away from the fluid 42 to control the temperature of the fluid. The heat transfer unit 40 includes a pump 41 for circulating the fluid 42 within the closed loop heat exchanger 30. In a preferred embodiment, the heat transfer unit 40 is an industrial chiller which is capable of controlling the temperature of the fluid from −40 degrees Celsius to +60 degrees Celsius. An example of an acceptable industrial chiller for use with the thermal conditioning apparatus is an FTS model RS25AL10 manufactured by FTS Systems, Inc., P.O. Box 158, Rt. 209, Stone Ridge, N.Y. 12484.

Referring to FIG. 1, at least one temperature sensor 54 is disposed adjacent the surface plate 12 to monitor the temperature of the surface plate. In a preferred embodiment, the temperature sensor 54 is embedded within the surface plate 12 and is in the form of a resistance temperature detector (RTD). Multiple temperature sensors 54 may be used (three are shown) to monitor the temperature at different locations across the surface plate 12 to help insure that the temperature is consistent along the surface plate 12. It is noted that other forms of temperature sensors may be used to monitor the temperature of the surface plate 12 such as thermocouples, infrared sensors, etc.

It is appreciated that the heat transfer fluid 42 flowing through the chamber 32 provides in essence a heat sink to remove heat from the bottom side 24 of thermoelectric device (when cooling the surface plate). During operation, any power (heat) provided to the thermoelectric devices 20 or removed from the surface plate 12 must be removed from the bottom side 24 of the thermoelectric device. The heat transfer fluid 42 of the closed loop heat exchanger 30 removes the heat load from the bottom side 24 of the thermoelectric device 20 while the heat transfer unit 40 provides a fluid temperature close to the desired temperature for the semiconductor unit (particularly when operating in the lower temperature range).

In this way, the combination of the thermoelectric device 20 and the closed loop heat exchanger 30 are able to rapidly change the temperature of the surface plate 12 over a wide temperature range. For example, a preferred embodiment of the thermal conditioning apparatus 10 is able to change the temperature of the surface plate 12 from −25 degrees Celsius to +125 degrees Celsius in approximately five minutes. This is a drastic improvement over prior art thermal conditioning integrated circuit handlers which often require 30 minutes or more for such a temperature change. Additionally, the thermoelectric devices 20 provide for increased accuracy in maintaining the temperature of the surface plate 12 at the desired temperature.

Referring to FIG. 8, the semiconductor thermal conditioning apparatus 10 is preferably designed for incorporation into a semiconductor handling and testing system which includes a loading system 80 for placing the semiconductor units onto the surface plate of the apparatus and an unloading system 82 for removing the semiconductor units from the surface plate of the apparatus.

Referring to FIGS. 9–10, the semiconductor thermal conditioning apparatus 10 of the present invention may be utilized in a variety of integrated circuit handling applications. For example, the thermal conditioning apparatus may be incorporated into a pick and place handler (see FIG. 9) in which a semiconductor unit 1 is loaded (80) onto the handler, transported to and inserted in the tester, and subsequently transported to a location where the semiconductor unit is unloaded (82) from the handler. The handler then returns to the loading area to pick up another semiconductor device to begin the next cycle. In such an application, the semiconductor unit 11 would be loaded directly on the surface plate 12 of the handler which would then thermally condition the semiconductor unit to a specified temperature as described above prior to testing of the semiconductor unit.

As shown in FIG. 10, the thermal conditioning apparatus 10 could alternatively be used with a gravity handler in which the semiconductor units 11 are loaded (i.e., from a tube 81) onto an inclined track or rail and then fed downward through the force of gravity into the tester. In such an application, the surface plate 12 of the thermal conditioning apparatus 10 would constitute the track or rail to thermally condition the semiconductor units 11 as they move toward the tester. After testing, the semiconductor units 11 are fed into a storage area 83 for sorting and storage of the semiconductor units. It is appreciated that the surface plate 12 of the thermal conditioning apparatus 10 may take a variety of forms and need not necessarily be a flat, planer surface. Rather, the shape of the surface plate 12 only needs to ensure contact with the semiconductor unit 11 for heat transfer through conduction.

According to another aspect of the present invention, the thermal conditioning apparatus 10 may be incorporated into a system for controlling the temperature of a semiconductor unit. Referring to FIG. 1, the temperature control system includes temperature sensors 54 embedded in the surface plate 12 to monitor the temperature of the surface plate and provide temperature feedback to a temperature controller 60. In one embodiment, the temperature controller 60 is a multi-axis servo controller which receives the temperature feedback from the RTD's and produces a drive signal based on programmed parameters which is sent to a high current servo amplifier 62 which supplies the appropriate power to the thermoelectric devices 20 to bring the surface plate 12 to a specified temperature and maintain the plate at such temperature (see FIG. 1). Additionally, a computer controller 70 is used to control the heat transfer unit 40 (or chiller unit) of the closed loop heat exchanger 30. The user enters a specified temperature (i.e., for the semiconductor unit to be tested) into the computer controller 70 and the computer controller 70 sets the fluid temperature of the heat transfer unit 40. The computer controller 70 communicates with the temperature controller 60 as the surface plate 12 is brought to the specified temperature through the thermoelectric devices 20 in conjunction with the closed loop heat exchanger 30. The temperature controller 60 constantly monitors the temperature of surface plate 12 to maintain it at the specified temperature once the surface plate reaches the specified temperature.

Figure 7:
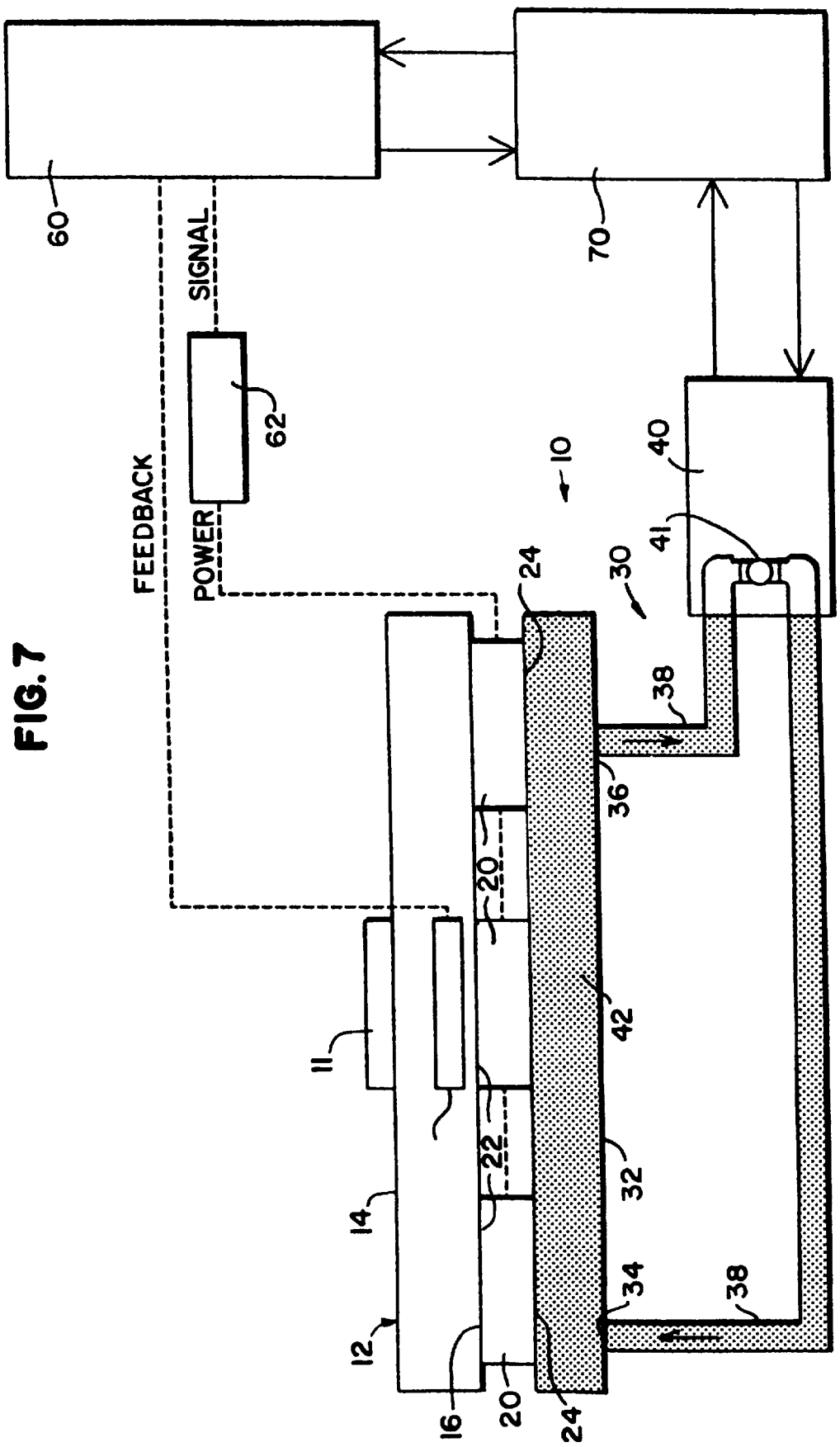
FIG. 7 is an block diagram of an alternative embodiment of an apparatus for thermal conditioning of a semiconductor unit according to the principles of the present invention.

Referring to FIG. 1, the thermoelectric devices 20 are shown connected in parallel with the temperature controller 60. Alternatively, the thermoelectric devices may be connected in series with the temperature controller 60 as shown in FIG. 7. Also, the number of temperature sensors 54 and thermoelectric devices 20 need not necessarily match. For example, the thermal conditioning apparatus 10 shown in FIG. 7 includes three thermoelectric devices 20 and one temperature sensor 54. The number of thermoelectric devices 20 and temperature sensors 54 used in the thermal conditioning apparatus 10 may vary widely depending on the requirements of the particular application.

Pursuant to another embodiment of the present invention, a thermal conditioning block 50 is illustrated in FIGS. 2–6. The thermal conditioning block 50 is preferably designed for use in a pick and place integrated circuit handler (see FIG. 9). The thermal conditioning block 50 includes a base 52 which is preferably formed of metal. The surface plate 12 is secured to the top of the base for contact with the semiconductor devices to be thermally conditioned. Preferably, several temperature sensors (RTD's) 54 are disposed within the surface plate 12 for sensing the temperature of the surface plate 12. The thermal conditioning block 50 includes at least one thermoelectric device (three are shown) disposed against an upper portion of the base 52 beneath the surface plate 12. The base 52 of the thermal conditioning block 50 includes a chamber or cavity 32 located adjacent the bottom of the thermoelectric devices 20 (see FIG. 4). An inlet 34 and outlet 36 lead to and from the chamber 32 (see FIGS. 5–6) and are adapted to receive appropriate tubing or conduit so that a heat transfer fluid 42 may be circulated within the chamber 32 of the base 52 of the thermal conditioning block 50. It is appreciated that the chamber or cavity 32 within the thermal conditioning block 50 may be formed and shaped in numerous ways as long as the chamber or cavity permits chiller fluid to flow adjacent the thermoelectric devices 20 to transfer heat to or from the bottom side 24 of the thermoelectric devices.

Figure 4:
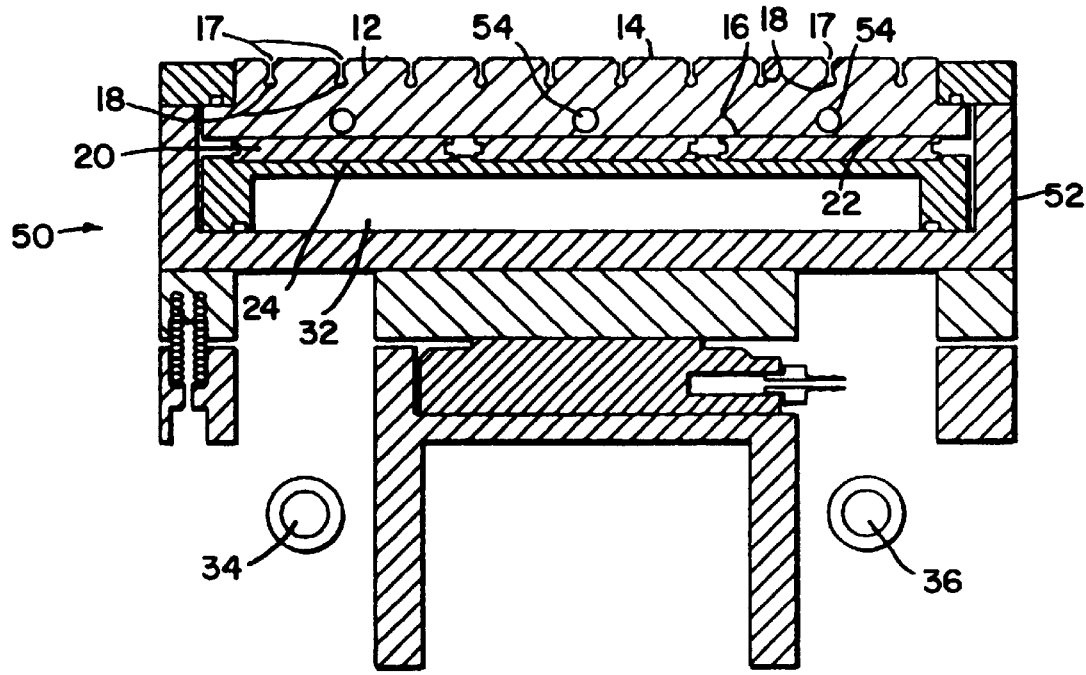
FIG. 4 is a view taken along line 4—4 in FIG. 3.
Figure 3:
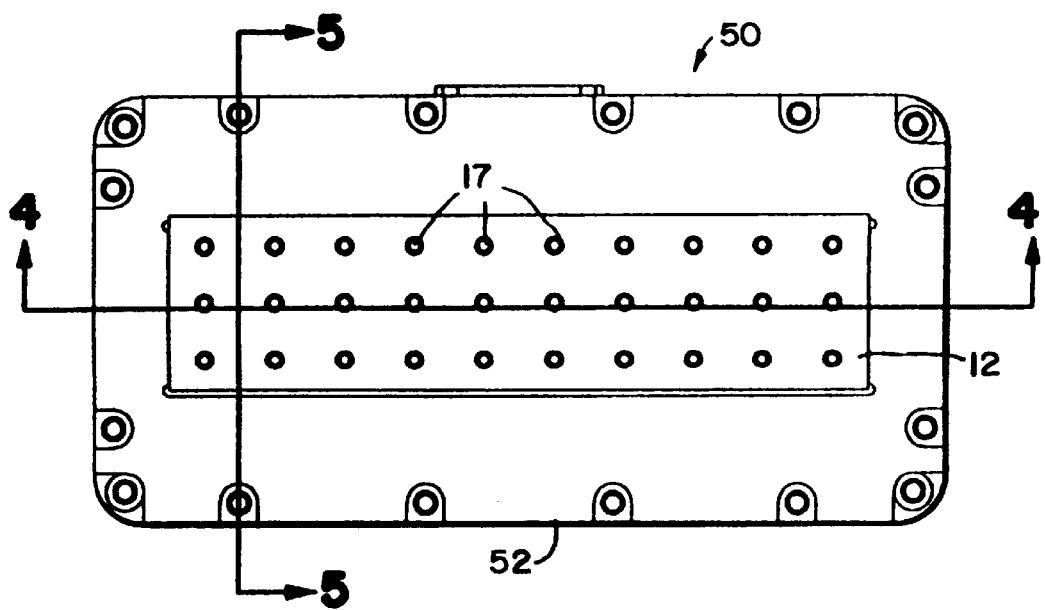
FIG. 3 is a top plan view of the thermal conditioning block shown in FIG. 2.
Figure 5:
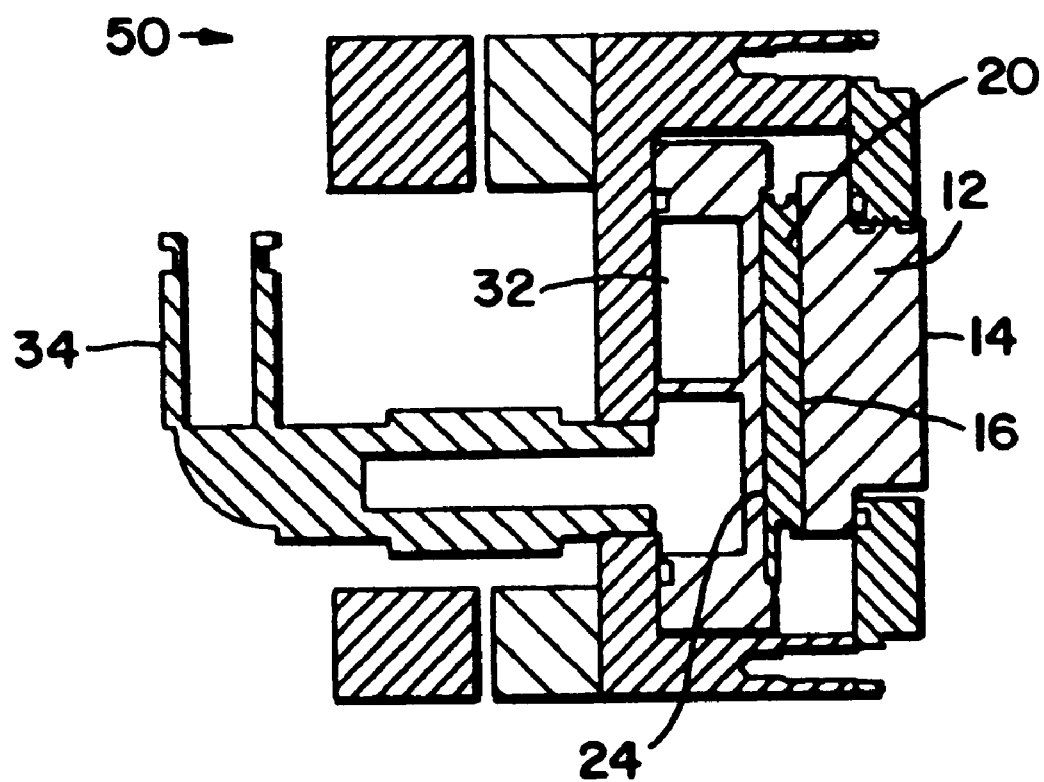
FIG. 5 is a view taken along line 5—5 in FIG. 3.
Figure 6:
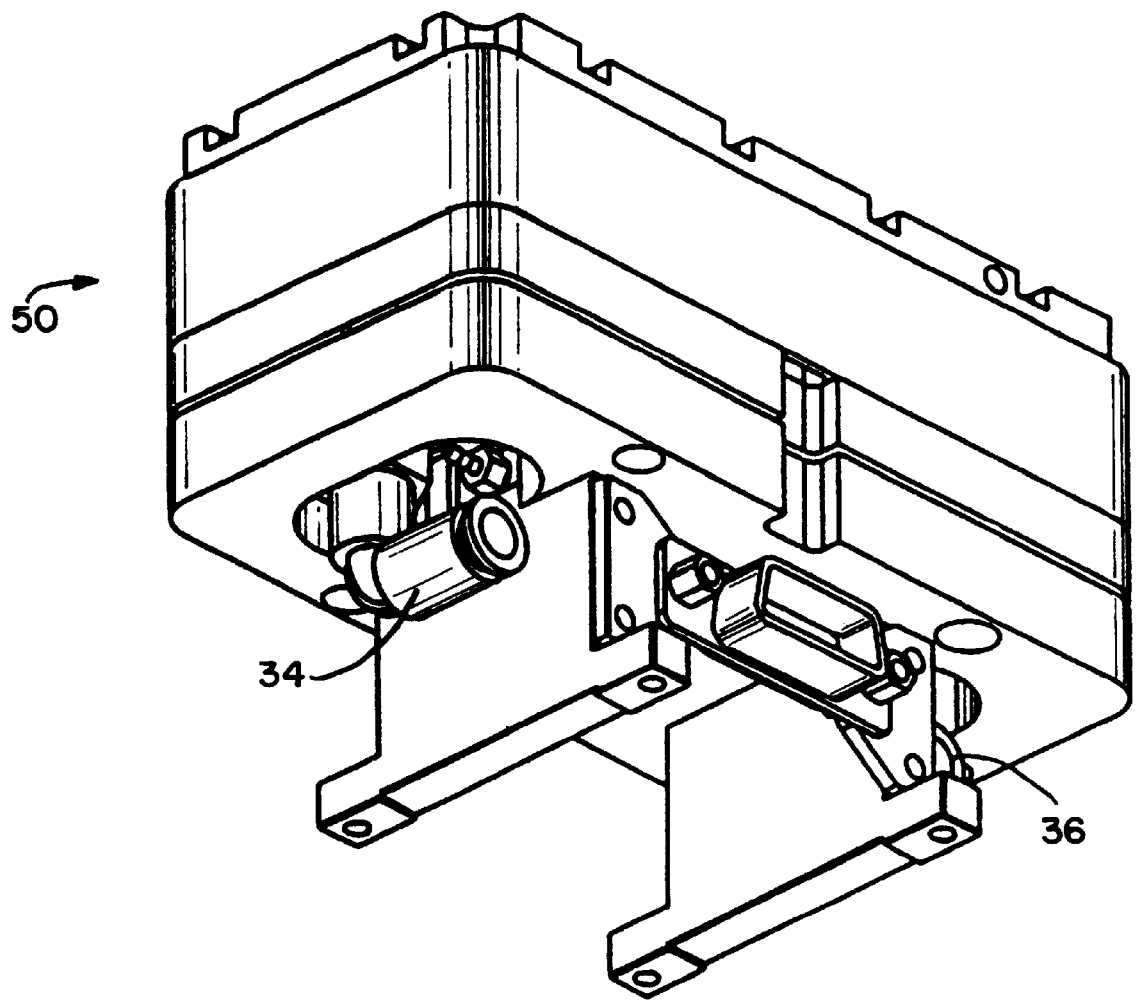
FIG. 6 is a perspective view of the underside of the thermal conditioning block shown in FIG. 2.

Referring to FIGS. 4–5, the thermal conditioning block 50 may preferably include apertures 17 in the upper surface 14 of the surface plate 12 which are connected to a vacuum line to create a suction effect to help insure that the semiconductor unit 11 is maintained in contact against the surface plate 12. The apertures 17 are spaced throughout the upper surface 14 of the surface plate 12 and are connected with a cavity 18 within the surface plate 12. The cavity 18 is connected to a vacuum line to create a vacuum through the apertures 17 so that when the semiconductor unit 11 is placed on the surface plate 12, the semiconductor unit 11 is secured in place against the surface plate 12 to insure efficient heat transfer through conduction from the surface plate. It is appreciated that other methods may be used to maintain the semiconductor unit 11 in continuous contact with the surface plate 12.

In operation of the thermal conditioning block 50, an industrial chiller having a pump is connected via appropriate tubing or conduit to the inlet 34 and outlet 36 of the thermal conditioning block 50 to establish a closed loop heat exchanger which circulates heat transfer fluid at a specified temperature through the thermal conditioning block 50. The thermal conditioning block 50 moves to the load area to receive the semiconductor devices to be tested. Preferably, the semiconductor units 11 are in post singulated form so that the semiconductor units lie in direct contact on the upper surface 14 of the surface plate 12. This allows for rapid heat transfer through conduction between the surface plate 12 and the semiconductor units 11.

If, for example, the specified temperature at which the semiconductor units are to be tested is below ambient room temperature, the chiller circulates the chiller fluid through the block 50 at approximately the specified temperature and heat flows from the surface plate 12 to the chiller fluid in the chamber 32 to bring the temperature of the surface plate 12 to approximately the specified temperature. Power is supplied to the thermoelectric devices 20 to finely adjust the temperature of the surface plate 12 so that the semiconductor units are brought to precisely the specified temperature. The thermal conditioning block 50 then moves to the tester area for inserting the semiconductor devices into the tester for testing at the specified temperature. It is appreciated that since the semiconductor units preferably remain in contact with the surface plate 12 of the thermal conditioning block 50 during testing, the semiconductor devices are maintained at the specified temperature throughout the entire test. After the semiconductor devices have been tested, the thermal conditioning block 50 moves to the unload area in which the semiconductor devices are unloaded and sorted according to the test results. It is appreciated that the thermal conditioning block 50 provides for thermal conditioning of semiconductor units prior to testing without requiring an enclosed area for heating or cooling of the devices. Rather, heat transfer through conduction between the surface plate 12 and the semiconductor units 11 provides for rapid, efficient thermal conditioning of the semiconductor units as compared to prior art thermal conditioning handlers. Additionally, much less power is required for heating or cooling the surface plate in the thermal conditioning apparatus 10 of the present invention as compared to prior art handlers which heat or cool a large enclosed area. This provides significant savings in operation costs over prior art thermal conditioning handlers.

While the present invention is illustrated as being incorporated into a handler system in which a single semiconductor thermal conditioning apparatus is utilized, it is appreciated that multiple thermal conditioning apparatuses 10 may be used based on the specific requirements of the handler and testing system. Multiple stations of thermal conditioning may be required for a particular system. For example, one semiconductor thermal conditioning apparatus 10 could be used to precondition the semiconductor units to be tested at a higher temperature. After testing, the semiconductor units could then be transferred to a second semiconductor thermal conditioning apparatus 10 which would cool the semiconductor units prior to the units being transferred to a storage area. It is appreciated that a variety of other systems using multiple thermal conditioning apparatuses 10 to create multiple stations of thermal conditioning in a semiconductor handling and testing system may be fashioned in accordance with the principles of the present invention.

It is to be understood that even though numerous characteristics and advantages of various embodiments of the present invention have been set forth in the foregoing description, together with the details of the structure and function of various embodiments of the invention, this disclosure is illustrative only and changes may be made in the details, especially in matters of shape, size, and arrangement in part within the principles of the present invention, to the full extent indicated by the broad general meaning of the terms in which the appended claims are expressed.

Other modifications of the invention will be apparent to those skilled in the art in view of the foregoing descriptions. These descriptions are intended to provide specific examples of embodiments which clearly disclose the present invention. Accordingly, the invention is not limited to the described embodiments or to use of specific elements, dimensions, materials, or configurations contained therein. All alternative modifications and variations of the present invention which fall within the spirit and broad scope of the appended claims are covered.

What is claimed is:

1. An apparatus for thermal conditioning of a semiconductor unit comprising:
    a surface plate for receiving the semiconductor unit thereon;
    at least one temperature sensor for sensing the temperature of the surface plate;
    a thermoelectric device having first and second sides with the first side disposed against the surface plate;
    a closed loop heat exchanger coupled to the second side of the thermoelectric device including:
        a chamber having an inlet and an outlet, the chamber disposed to and in connection with the second side of the thermoelectric device, conduit connected to the inlet and outlet of the chamber, a heat transfer unit connected to the conduit opposite the chamber, a heat transfer fluid contained within the chamber, conduit and heat transfer unit, and a pump connected to the conduit for pumping the heat transfer fluid through the closed loop heat exchanger, wherein the heat transfer unit transfers heat to or from the heat transfer fluid to control the temperature of the heat transfer fluid,
    wherein the thermoelectric device transfers heat to or from the surface plate to thermally condition the semiconductor device disposed on the surface plate and the closed loop heat exchanger transfers heat to or from the second side of the thermoelectric device to increase the range of temperature under which the semiconductor unit may be thermally conditioned by the surface plate.

2. An apparatus according to claim 1 wherein the temperature sensor is coupled to a temperature control unit wherein the temperature control unit is capable of bringing the surface plate to a specified temperature and wherein the temperature control unit receives input from the temperature sensor of the temperature of the surface plate and the temperature control unit then provides energy to the thermoelectric device to bring the temperature of the surface plate to the specified temperature.

3. An apparatus according to claim 1 wherein the heat transfer unit comprises a chiller unit which can control the temperature of the heat transfer fluid flowing through the closed loop heat exchanger from −40 degrees Celsius to +60 degrees Celsius.

4. An apparatus according to claim 1 wherein the thermoelectric device coupled with the closed loop heat exchanger is able to vary the temperature of the surface plate from −40 degrees Celsius to +125 Celsius and maintain the surface plate at a temperature within that range.

5. An apparatus for thermally conditioning a semiconductor unit comprising:
    a thermal conditioning block having a base with an upper surface and including a surface plate disposed to and in connection with the upper surface of the base for receiving the semiconductor unit thereon, at least one temperature sensor for sensing the temperature of the surface plate, and at least one thermoelectric device disposed on the base of the thermal conditioning block beneath the surface plate, the thermoelectric device transferring heat to or from the surface plate to thermally condition the semiconductor unit disposed on the surface plate of the thermal conditioning block through conduction from the surface plate, the base of the thermal conditioning block defining a cavity which is located to and in connection with the thermoelectric device opposite the surface plate with the cavity having an inlet and outlet; and
    a heat transfer unit coupled to inlet and outlet of the cavity in the base of the thermal conditioning block wherein a heat transfer fluid is circulated through the cavity in the base of the thermal conditioning block to transfer heat to or from the thermoelectric device and the heat transfer unit transfers heat to or from the heat transfer fluid to control the temperature of the heat transfer fluid.

6. The apparatus according to claim 5 wherein the heat transfer unit constitutes a low temperature industrial chiller.

7. The apparatus according to claim 6 wherein a plurality of thermoelectric devices are disposed beneath the surface plate in the base of the thermal conditioning block for transferring heat to and from the surface plate to thermally condition the semiconductor unit disposed on the surface plate.

8. A system for controlling the temperature of a semiconductor unit at a specified temperature, comprising:
    a surface plate for receiving the semiconductor unit thereon having at least one temperature sensor disposed within the surface plate for sensing the temperature of the surface plate;
    a thermoelectric device having first and second sides with the first side disposed against the surface plate;
    a closed loop heat exchanger coupled to the second side of the thermoelectric device including:

a chamber having an inlet and an outlet, the chamber disposed to and in connection with the second side of the thermoelectric device, conduit connected to the inlet and outlet of the chamber, a heat transfer unit connected to the conduit opposite the chamber, a heat transfer fluid contained within the chamber, conduit and heat transfer unit, and a pump connected to the conduit for pumping the heat transfer fluid through the closed loop heat exchanger, wherein the heat transfer unit transfers heat to or from the heat transfer fluid to control the temperature of the heat transfer fluid, wherein the thermoelectric device transfers heat to or from the surface plate to thermally condition the semiconductor unit disposed on the surface plate and the closed loop heat exchanger transfers heat to or from the second side of the thermoelectric device to increase the range of temperature under which the semiconductor device may be thermally conditioned by the surface plate;

a temperature controller coupled to the temperature sensor and the thermoelectric device, wherein the temperature controller receives feedback information from the temperature sensor on the temperature of the surface plate and the temperature controller supplies power to the thermoelectric device to bring the temperature of the surface plate to the specified temperature and maintain the surface plate at the specified temperature; and a computer controller coupled to the heat transfer unit of the closed loop heat exchanger and the temperature controller, wherein the computer controller receives an input of the specified temperature for the semiconductor unit and sets the temperature of the heat transfer fluid within the closed loop heat exchanger to bring the temperature of the surface plate to the specified temperature in conjunction with the thermoelectric device controlled by the temperature controller.

9. A system according to claim 8 wherein the temperature controller includes a high current servo amplifier for supplying power to the thermoelectric device, wherein the high current servo amplifier receives a control signal from the temperature controller based on the feedback received from the temperature sensor.

10. A system according to claim 8 wherein a plurality of thermoelectric devices are disposed against the surface plate and the thermoelectric devices are connected in series with the temperature controller.

11. A system according to claim 8 wherein a plurality of thermoelectric devices are disposed against the surface plate and the thermoelectric devices are connected in parallel with the temperature controller.

12. A method for thermally conditioning a semiconductor unit, comprising the steps of:

loading a semiconductor unit onto the surface plate of a thermal conditioning apparatus in which the surface plate is connected to a thermoelectric device coupled with a closed loop heat exchanger;

specifying a temperature to which the semiconductor device is to be thermally conditioned;

transferring heat to or from the thermoelectric device to the surface plate of the thermal conditioning apparatus while the closed loop heat exchanger transfers heat to or from the thermoelectric device to bring the surface plate to the specified temperature;

monitoring the temperature of the surface plate with a temperature sensor to determine when the surface plate has reached the specified temperature; and maintaining the temperature of the surface plate at the specified temperature through the transfer of heat to or from the thermoelectric device to the surface plate so that the semiconductor unit on the surface plate is brought to the specified temperature through conduction from the surface plate.

13. The method of claim 12 further comprising the step of:

unloading the semiconductor unit from the surface plate of the thermal conditioning unit after the semiconductor unit has been brought to the specified temperature.

\* \* \* \* \*